(12) United States Patent
Sugiyama et al.

(10) Patent No.: US 11,187,754 B2
(45) Date of Patent: Nov. 30, 2021

(54) INTERNAL STATE ESTIMATION APPARATUS AND METHOD, AND BATTERY CONTROL APPARATUS

(71) Applicant: KABUSHIKI KAISHA TOSHIBA, Tokyo (JP)

(72) Inventors: Nobukatsu Sugiyama, Kawasaki Kanagawa (JP); Yumi Fujita, Tokyo (JP); Tomokazu Morita, Funabashi Chiba (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 269 days.

(21) Appl. No.: 16/556,317

(22) Filed: Aug. 30, 2019

(65) Prior Publication Data

US 2020/0217901 A1 Jul. 9, 2020

(30) Foreign Application Priority Data

Jan. 4, 2019 (JP) .............................. JP2019-000221

(51) Int. Cl.
*H02J 7/00* (2006.01)
*G01R 31/3842* (2019.01)
(Continued)

(52) U.S. Cl.
CPC .... *G01R 31/3842* (2019.01); *H01M 10/0525* (2013.01); *H01M 10/4257* (2013.01);
(Continued)

(58) Field of Classification Search
USPC ........................................................ 320/132
See application file for complete search history.

(56) References Cited

U.S. PATENT DOCUMENTS

| 8,653,794 | B2 * | 2/2014 | Joe | G01R 31/378 |
| | | | | 320/134 |
| 8,680,815 | B2 * | 3/2014 | Wang | G01R 31/392 |
| | | | | 320/132 |

(Continued)

FOREIGN PATENT DOCUMENTS

| JP | 2011-220917 A | 11/2011 |
| JP | 2013-89424 A | 5/2013 |

(Continued)

*Primary Examiner* — Samuel Berhanu
(74) *Attorney, Agent, or Firm* — Finnegan, Henderson, Farabow, Garrett & Dunner, L.L.P.

(57) ABSTRACT

According to an embodiment, an internal state estimation apparatus includes a capacity estimator, a charge amount estimator, and a SOC estimator. The capacity estimator calculates an estimate capacity of the electrode based on an estimate capacity of the electrode at the first time point, a coefficient that is dependent at least on a SOC of the electrode at the first time point, and the time difference. The charge amount estimator calculates an estimate initial charge amount of the electrode based on an estimate initial charge amount and capacity of the electrode, and the estimate battery charge amount at the first time point, the coefficient, and the time difference. The SOC estimator calculates a SOC estimate of the electrode based on the estimate battery charge amount, and the estimate initial charge amount and capacity of the electrode.

13 Claims, 11 Drawing Sheets

(51) Int. Cl.
*H01M 10/0525* (2010.01)
*H01M 10/44* (2006.01)
*H01M 10/42* (2006.01)

(52) U.S. Cl.
CPC ....... *H01M 10/443* (2013.01); *H02J 7/00036* (2020.01); *H02J 7/0091* (2013.01); *H02J 7/00718* (2020.01); *H02J 7/007184* (2020.01); *H01M 2010/4271* (2013.01)

(56) References Cited

U.S. PATENT DOCUMENTS

| | | |
|---|---|---|
| 2013/0096858 A1 | 4/2013 | Amano et al. |
| 2013/0099794 A1 | 4/2013 | Takahashi et al. |
| 2013/0317771 A1* | 11/2013 | Laskowsky ............. B60L 58/12 |
| | | 702/63 |
| 2015/0160300 A1 | 6/2015 | Ishii et al. |
| 2016/0104924 A1* | 4/2016 | Kamijoh ............. H01M 10/613 |
| | | 429/62 |
| 2016/0351974 A1 | 12/2016 | Oniki |
| 2017/0263984 A1* | 9/2017 | Fujita .................. H01M 10/482 |

FOREIGN PATENT DOCUMENTS

| | | |
|---|---|---|
| JP | 2013-160538 A | 8/2013 |
| JP | 2014-207054 A | 10/2014 |
| JP | 2015-111086 A | 6/2015 |
| JP | 2017-166874 A | 9/2017 |
| JP | 6350875 B2 | 6/2018 |

* cited by examiner

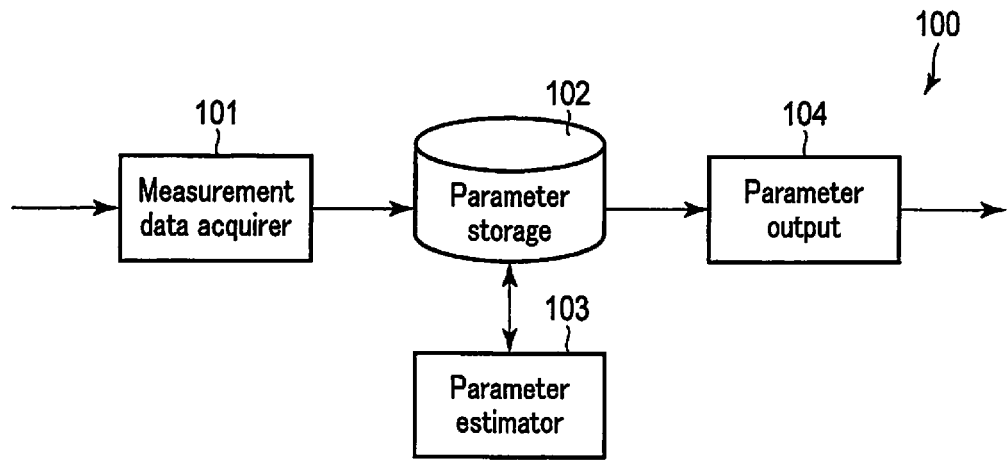
F I G. 1
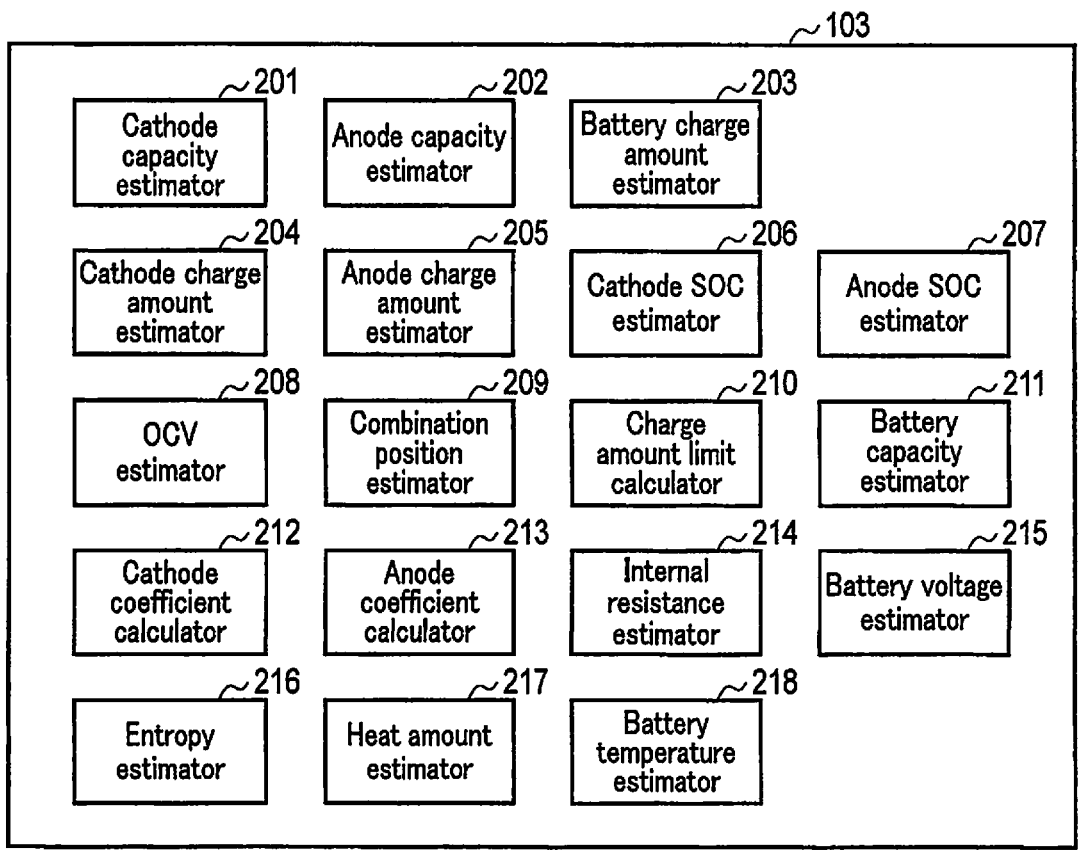
F I G. 2

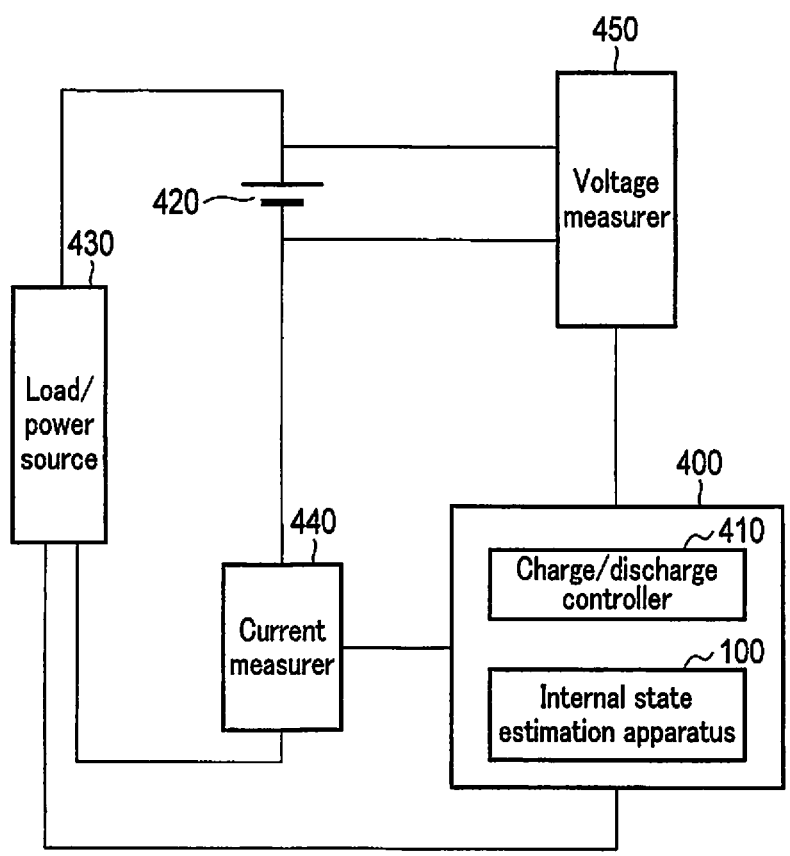
F I G. 15

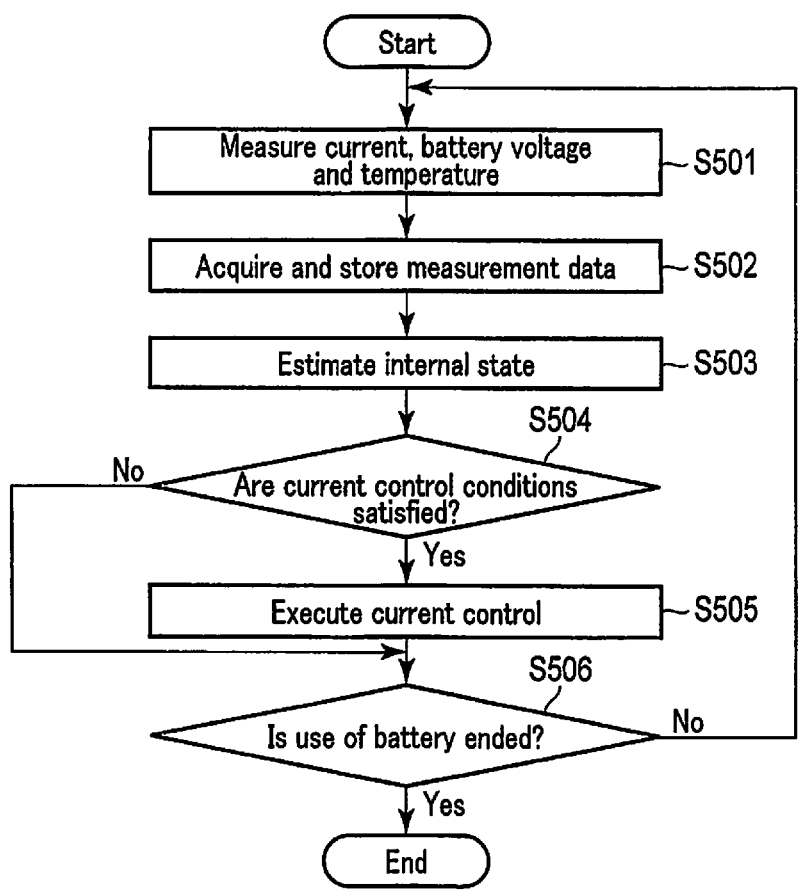
F I G. 16

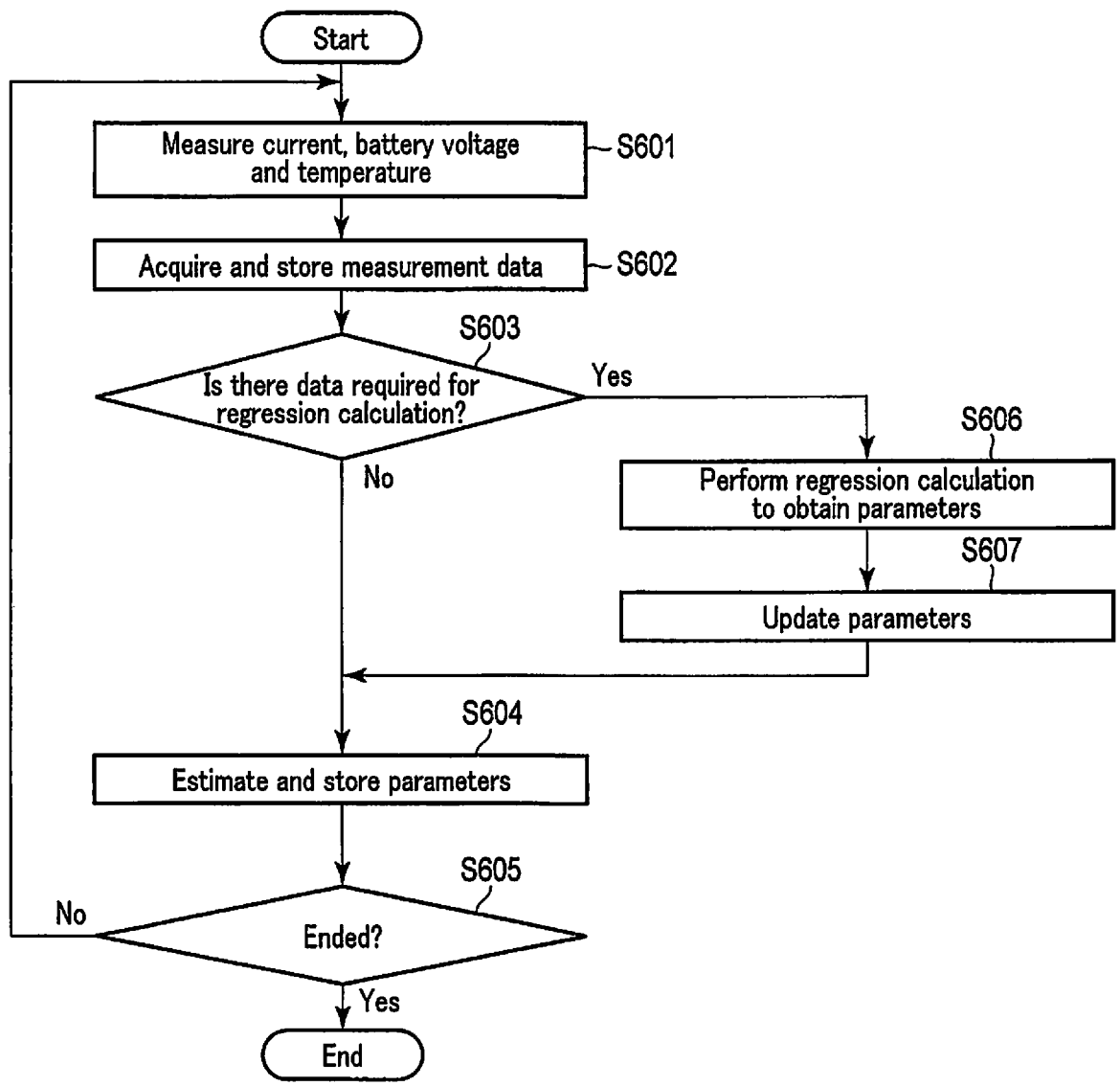
F I G. 17

INTERNAL STATE ESTIMATION APPARATUS AND METHOD, AND BATTERY CONTROL APPARATUS

CROSS-REFERENCE TO RELATED APPLICATIONS

This application is based upon and claims the benefit of priority from Japanese Patent Application No. 2019-000221, filed Jan. 4, 2019, the entire contents of which are incorporated herein by reference.

FIELD

Embodiments described herein relate generally to estimation of the internal state of a secondary battery.

BACKGROUND

Recently, as the prevalence of electronic devices including information-related devices and communication devices increases, so too does the prevalence of secondary batteries that serve as a power supply to such devices. Secondary batteries are also advancing in popularity in the fields of electric vehicles (EV) and renewable energy. Particularly, a lithium-ion secondary battery has been broadly used because of its high energy density and easiness of being downsized.

A lithium-ion secondary battery charges and discharges electric energy with the active material of the cathode and anode absorbing and releasing lithium ions. Specifically, at the time of charging, lithium ions released from the cathode are absorbed by the anode, whereas at the time of discharging, lithium ions discharged from the anode are absorbed by the cathode.

It has been known that secondary batteries, including lithium-ion secondary batteries, deteriorate in accordance with their state of usage. As an indicator of a decrease in capacity of a lithium-ion secondary battery, the state of health (SOH) has been used. The SOH indicates a ratio of the current battery capacity to the initial battery capacity. According to one known technique, for instance, the SOH can be estimated using a table that shows the deterioration speed coefficients in association with a combination of the temperature and the state of charge (SOC) of the battery.

The SOH is an indicator of a decrease in capacity, which is merely one example of the deterioration of a secondary battery. Various deterioration factors in the internal state of the secondary battery may also reduce the capacity. The SOH may indicate the amount of decrease in capacity, but cannot indicate what factor of the internal state is underlying the decrease in capacity. In other words, the SOH cannot provide the details of the internal state of the secondary battery. In addition to the decrease in capacity, an increase in the internal resistance has been known as a factor of the deterioration of the secondary battery. In consideration of this, the estimation of the internal state of a secondary battery in greater detail has importance.

BRIEF DESCRIPTION OF THE DRAWINGS

FIG. 1 is a block diagram showing an exemplary internal state estimation apparatus according to the first embodiment.

FIG. 2 is a block diagram showing an example of a parameter estimator included in FIG. 1.

FIG. 15 is a block diagram exemplifying a battery control system according to the third embodiment.

FIG. 16 is a flowchart exemplifying the operation of the battery control system illustrated in FIG. 15.

FIG. 17 is a flowchart exemplifying the operation of the internal state estimation apparatus according to the fourth embodiment.

DETAILED DESCRIPTION

Figure 3:
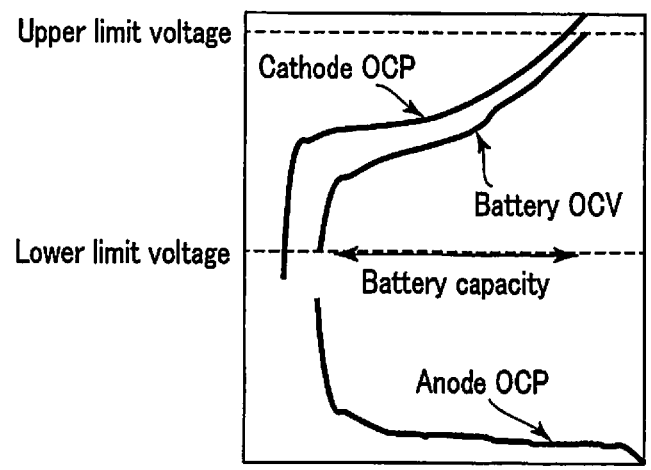
FIG. 3 is a graph showing examples of OCV of a non-deteriorated secondary battery, and OCPs of the cathode and anode.

According to an embodiment, an internal state estimation apparatus for a secondary battery is provided. The apparatus includes an acquirer, a battery capacity estimator, a cathode capacity estimator, an anode capacity estimator, a cathode charge amount estimator, an anode charge amount estimator, a cathode SOC estimator, and an anode SOC estimator. The acquirer acquires input data including at least one of (a) current measurement values and/or power measurement values measured at a plurality of time points during charging and/or discharging of the secondary battery, and (b) estimate current values and/or estimate power values at a plurality of time points during charging and/or discharging of the secondary battery. The battery capacity estimator calculates an estimate battery charge amount of the secondary battery at the second time point based on the input data, an estimate battery charge amount of the secondary battery at a first time point, and a time difference between the first time point and a second time point that is later than the first time point. The cathode capacity estimator calculates an estimate capacity of the cathode at the second time point based on an estimate capacity of a cathode of the secondary battery at the first time point, a cathode capacity deterioration coefficient that is dependent at least on a state of charge (SOC) of the cathode at the first time point, and the time difference. The anode capacity estimator calculates an estimate capacity of the anode at the second time point based on an estimate capacity of an anode of the secondary battery at the first time point, an anode capacity deterioration coefficient that is dependent at least on a SOC of the anode at the first time point, and the time difference. The cathode charge amount estimator calculates an estimate initial charge amount of the cathode at the second time point based on an estimate initial charge amount of the cathode at the first time point, the estimate battery charge amount at the first time point, the cathode capacity deterioration coefficient, the estimate capacity of the cathode at the first time point, and the time difference. The anode charge amount estimator calculates an estimate initial charge amount of the anode at the second time point based on an estimate initial charge amount of the anode at the first time point, the estimate battery charge amount at the first time point, the anode capacity deterioration coefficient, the time difference, the estimate capacity of the anode at the first time point, and an anode charge amount deterioration coefficient that is dependent at least on the SOC of the anode at the first time point. The cathode SOC estimator calculates a SOC estimate of the cathode at the second time point based on the estimate battery charge amount at the second time point, the estimate initial charge amount of the cathode at the second time point, and the estimate capacity of the cathode at the second time point. The anode SOC estimator calculates a SOC estimate of the anode at the second time point based on the estimate battery charge amount at the second time point, the estimate initial charge amount of the anode at the second time point, and the estimate capacity of the anode at the second time point.

The embodiments will be described below with reference to the drawings. The same or similar reference numerals are applied to the components that are the same as or similar to the explained components. Repetition of explanations made before is basically avoided. The drawings are schematically or conceptually illustrated, and therefore the relationship between the thickness and width of each illustrated component and relative sizes of the components may not be the same as the actual arrangement. Furthermore, even if the same portion is described, it may be illustrated differently in sizes and ratios on different drawings.

First Embodiment

As illustrated in FIG. 1, an internal state estimation apparatus 100 according to the first embodiment includes a measurement data acquirer 101, a parameter storage 102, a parameter estimator 103, and a parameter output 104.

The measurement data acquirer 101 may correspond to an input/output interface and/or communication interface, and a processor. Typical examples of the processor are a central processing unit (CPU) and/or graphics processing unit (GPU); however, a microcomputer, field programmable gate array (FPGA), digital signal processor (DSP), or any other general-purpose processor or dedicated processor are also included.

The measurement data acquirer 101 acquires the input data of the target secondary battery, which includes the current and/or power data indicating the measurement values of the current and/or power of the battery. The input data may be acquired directly from a measurement device such as an ammeter, or may be acquired from a remotely arranged controller of the secondary battery in wired or wireless communications. The current and/or power may be measured at different time points during the charging and/or discharging of the secondary battery. The input data may further include temperature data. The temperature data may indicate the measurement values of the temperature of the target secondary battery and/or its ambient temperature. The current/power/temperature data may include values indicating the time points of measuring the current, power and/or temperature in addition to these measurement values. The measurement data acquirer 101 writes the input data into the parameter storage 102.

The parameter storage 102 may correspond to a memory, an auxiliary storage device, or the like. The auxiliary storage device may be a hard disk drive (HDD), solid state drive (SSD), or any other semiconductor memory.

The measurement data acquirer 101 writes the input data into the parameter storage 102. In the parameter storage 102, various deterioration coefficients, functions (which may be curve data or a look-up table (LOT)), and fixed parameters (e.g., later-described upper limit voltage, lower limit voltage, and initial values of parameters), which will be described later, are pre-stored so as to be used by the parameter estimator 103 for the estimation of internal state parameters. Into the parameter storage 102, the internal state parameters are further written by the parameter estimator 103. The data including the internal state parameters is read from the parameter storage 102 by the parameter output 104.

The parameter estimator 103 may correspond to the processor. The parameter estimator 103 reads input data, deterioration coefficients, functions, fixed parameters, estimated internal state parameters, and the like from the parameter storage 102. The parameter estimator 103 estimates, based on the read-out data, the internal state parameters of the target secondary battery. The estimation of the internal state parameters by the parameter estimator 103 will be described later in detail. The parameter estimator 103 writes the estimated internal state parameters into the parameter storage 102.

The parameter output 104 may correspond to an input/output interface and/or communication interface, and a processor. The parameter output 104 reads the internal state parameters of the target secondary battery from the parameter storage 102, and outputs these parameters. Outputting may be realized by presentation on an output device such as a display or loudspeaker in the form of text, video or audio, or may be sent to an external device. The parameter output 104 may automatically output the internal state parameters, or output them in response to a request from the user.

The estimation of the internal state parameters by the parameter estimator 103 will be explained in detail. First, the battery capacity and SOC in this specification will be defined. In general, the capacity of a lithium-ion secondary battery is calculated based on the upper limit voltage determined at the time of charging and the lower limit voltage determined at the time of discharging.

In this specification, however, the capacity of a secondary battery is defined with reference to the open circuit voltage (OCV) of the secondary battery. Specifically, the capacity of the secondary battery is defined as the charging capacity when charging the secondary battery during a period of the OCV changing from the predetermined lower limit voltage to the predetermined upper limit voltage, or as the discharging capacity of the secondary battery when discharging the secondary battery during a period of the OCV changing from the upper limit voltage to the lower limit voltage.

Throughout the specification, the SOC of a secondary battery represents the ratio of the charge amount of the secondary battery to the capacity of the secondary battery, where the OCV at the lower limit voltage is 0[%], and the OCV at the upper limit voltage is 100[%].

Throughout the specification, the SOC of the cathode of the secondary battery represents the ratio of the charge amount of the cathode to the capacity of the cathode, where the open circuit potential (OCP) of the cathode at the lower limit potential is 0[%], and the OCP at the upper limit potential is 100[%].

Similarly, throughout the specification, the SOC of the anode of the secondary battery represents the ratio of the charge amount of the anode with reference to the capacity of the anode, where the OCP of the anode at the lower limit potential is 0[%], and the OCP at the upper limit potential is 100[%].

The parameter estimator 103 estimates the internal state parameters every unit time t (t=1, 2, ... ). As illustrated in FIG. 2, the parameter estimator 103 may include a cathode capacity estimator 201, an anode capacity estimator 202, a battery charge amount estimator 203, a cathode charge amount estimator 204, an anode charge amount estimator 205, a cathode SOC estimator 206, an anode SOC estimator 207, an OCV estimator 208, a combination position estimator 209, a charge amount limit calculator 210, a battery capacity estimator 211, a cathode coefficient calculator 212, an anode coefficient calculator 213, an internal resistance estimator 214, a battery voltage estimator 215, an entropy estimator 216, a heat amount estimator 217, and a battery temperature estimator 218.

The cathode capacity estimator 201 calculates the estimate capacity of the cathode of the target secondary battery every unit time. Specifically, the cathode capacity estimator 201 reads from the parameter storage 102 the estimate capacity of the cathode Mc(t−1) at time t−1, a cathode capacity deterioration coefficient δMc(t−1) that is dependent on the SOC of the cathode at least at time t−1, and a time difference Δt between time t−1 and time t. The parameter storage 102 stores therein Mc(0) as one of initial values. The cathode capacity estimator 201 calculates the estimate capacity of the cathode Mc(t) at time t in accordance with formula (1).

$$Mc(t)=Mc(t-1)+\delta Mc(t-1)\Delta t \quad (1)$$

The anode capacity estimator 202 calculates the estimate capacity of the anode of the target secondary battery every unit time. Specifically, the anode capacity estimator 202 reads from the parameter storage 102 an estimate capacity of the anode Ma (t−1) at time t−1, an anode capacity deterioration coefficient δMa (t−1) dependent at least on the SOC of the anode at time t−1, and the time difference Δt. The parameter storage 102 stores therein Ma (0) as one of initial values. The anode capacity estimator 202 calculates the estimate capacity of the anode Malt) at time t in accordance with formula (2).

$$Ma(t)=Ma(t-1)+\delta Ma(t-1)\Delta t \quad (2)$$

The battery charge amount estimator 203 calculates the battery charge amount of the target secondary battery every unit time. Specifically, the battery charge amount estimator 203 reads from the parameter storage 102 the estimate battery charge amount Q(t−1) of the secondary battery at time t−1, the time difference Δt, and input data such as the current measurement value I(t) at time t. The parameter storage 102 stores therein Q(0) as one of the initial values. The battery charge amount estimator 203 calculates an estimate battery charge amount Q(t) of the secondary battery at time t in accordance with formula (3).

$$Q(t)=(t-1)+I(t)\Delta t \quad (3)$$

The battery charge amount estimator 203 may use, as the input data, the current measurement value I(t−1) at time t−1, or the average value of I(t) and I(t−1), in place of the current measurement value I(t) at time t. Alternatively, the battery charge amount estimator 203 may calculate, as input data, the estimate battery charge amount Q(t) of the secondary battery at time t, based on the power measurement value P(t) and/or P(t−1) at time t and/or time t−1.

The cathode charge amount estimator 204 calculates the estimate initial charge amount of the cathode of the target secondary battery every unit time. The estimate initial charge amount of the cathode represents the charge amount of the cathode when the SOC of the cathode is 0. Similarly, the estimate initial charge amount of the anode represents the charge amount of the anode when the SOC of the anode is 0.

The initial charge amount of the cathode and the initial charge amount of the anode of a lithium-ion secondary battery change respectively in accordance with the change of the cathode capacity and the change of the anode capacity. It is assumed here that, with a certain battery charge amount Q, the cathode capacity Mc and the anode capacity Ma change respectively by ΔMc and ΔMa. The changed cathode capacity Mc' and the changed anode capacity Ma' can be expressed by formulae (4).

$$Mc'=Mc\pm\Delta Mc$$

$$Ma'=Ma+\Delta Ma \quad (4)$$

If the potential of the cathode and the potential of the anode, or in other words, the SOC of the cathode and the SOC of the anode, would not change before and after the cathode capacity and anode capacity are changed, the formulae (5) and (6) are established.

$$\frac{Q+Q0c}{Mc}=\frac{Q+Q0c'}{Mc+\Delta Mc} \quad (5)$$

$$\frac{Q+Q0a}{Ma}=\frac{Q+Q0a'}{Ma+\Delta Ma} \quad (6)$$

In formula (5), the left side represents the SOC of the cathode before the change of the cathode capacity, and the right side represents the SOC of the cathode after the change of the cathode capacity. Q0c represents the initial charge amount of the cathode before the change of the cathode capacity, and Q0c' represents the initial charge amount of the cathode after the change of the cathode capacity.

Similarly, in formula (6), the left side represents the SOC of the anode before the change of the anode capacity, and the right side represents the SOC of the anode after the change of the anode capacity. Q0a represents the initial charge amount of the anode before the change of the anode capacity, and Q0a' represents the initial charge amount of the anode after the change of the anode capacity.

By transposing the formulae (5) and (6), the following formulae (7) are derived.

$$Q0c' = Q0c + \frac{(Q + Q0c)\Delta Mc}{Mc} \quad (7)$$

$$Q0a' = Q0a + \frac{(Q + Q0a)\Delta Ma}{Ma}$$

The cathode charge amount estimator 204 calculates the estimate initial charge amount of the cathode in consideration of the change of the initial charge amount of the cathode before and after the change of the cathode capacity expressed by the above formula (7). Specifically, the cathode charge amount estimator 204 reads, from the parameter storage 102, the estimate initial charge amount of the cathode Q0c(t−1), the estimate battery charge amount Q(t−1), the cathode capacity deterioration coefficient δMc(t−1), the estimate cathode capacity Mc (t−1) at time t−1, and the time difference Δt. The parameter storage 102 stores therein Q0c(0) as one of the initial values. The cathode charge amount estimator 204 calculates the estimate initial charge amount of the cathode Q0c(t) at time t in accordance with formula (8).

$$Q0c(t) = Q0c(t-1) + \frac{(Q(t-1) + Q0c(t-1))\delta Mc(t-1)}{Mc(t-1)}\Delta t \quad (8)$$

The anode charge amount estimator 205 calculates the estimate initial charge amount of the anode of the target secondary battery every time unit. The initial charge amount of the anode of a lithium-ion secondary battery changes in accordance with the consumption of lithium ions due to the side reaction of the anode or the like, in addition to the change of the anode capacity. The consumption of lithium ions at the anode adversely reduces the initial charge amount of the anode by the consumed amount.

The anode charge amount estimator 205 calculates the estimate initial charge amount of the anode in consideration of the change of the initial charge amount of the anode before and after the change of the anode capacity expressed in the above formula (7), and the lithium ions consumed at the anode. Specifically, the anode charge amount estimator 205 reads, from the parameter storage 102, the estimate initial charge amount of the anode Q0a(t−1), the estimate battery charge amount Q (t−1), the anode capacity deterioration coefficient δMa (t−1), the estimate capacity of the anode Ma (t−1) at time t−1, the time difference Δt, and the anode charge amount deterioration coefficient QLi (t−1) that is dependent at least on the SOC of the anode at time t−1. The parameter storage 102 stores therein Q0a(0) as one of the initial values. The anode charge amount estimator 205 calculates the estimate initial charge amount of the anode Q0a(t) at time t in accordance with formula (9).

$$Q0a(t) = \quad (9)$$
$$Q0a(t-1) + \frac{(Q(t-1) + Q0a(t-1))\delta Ma(t-1)}{Ma(t-1)}\Delta t - QLi(t-1)\Delta t$$

The cathode SOC estimator 206 calculates the SOC of the cathode of the target secondary battery every unit time. Specifically, the cathode SOC estimator 206 reads the estimate battery charge amount Q(t), the estimate initial charge amount of the cathode Q0c (t), and the cathode capacity Mc (t) from the parameter storage 102. Then, the cathode SOC estimator 206 calculates the estimate cathode SOC (SOCc (t)) of the secondary battery at time t in accordance with formula (10).

$$SOCc(t) = \frac{Q(t) + Q0c(t)}{Mc(t)} \quad (10)$$

The anode SOC estimator 207 calculates the SOC of the anode of the target secondary battery every unit time. Specifically, the anode SOC estimator 207 reads the estimate battery charge amount Q(t), the estimate initial charge amount of the anode Q0a(t), and the anode capacity Ma (t) from the parameter storage 102. Then, the anode SOC estimator 207 calculates the estimate anode SOC (SOCa(t)) of the secondary battery at time t in accordance with formula (11).

$$SOCa(t) = \frac{Q(t) + Q0a(t)}{Ma(t)} \quad (11)$$

The OCV estimator 208 calculates the OCV of the target secondary battery every unit time. Specifically, the OCV estimator 208 reads from the parameter storage 102 the estimate cathode SOC (SOCc(t)) and the estimate anode SOC (SOCa(t)), the function fc(SOCc) that returns the OCP of the cathode in correspondence with the SOC of the cathode, and the function fa(SOCa) that returns the OCP of the anode in correspondence with the SOC of the anode. The functions fc(SOCc) and fa(SOCa) may be derived from experiments or simulations. Then, the OCV estimator 208 calculates an estimate OCV (OCV(t)) of the secondary battery at time t in accordance with formula (12).

$$OCV(t) = fc(SOCc(t)) - fa(SOCa(t)) \quad (12)$$

In formula (12), fc(SOCc(t)) represents the OCP estimate of the cathode at time t, and fa(SOCa(t)) represents the OCP estimate of the anode at time t.

Figure 7:
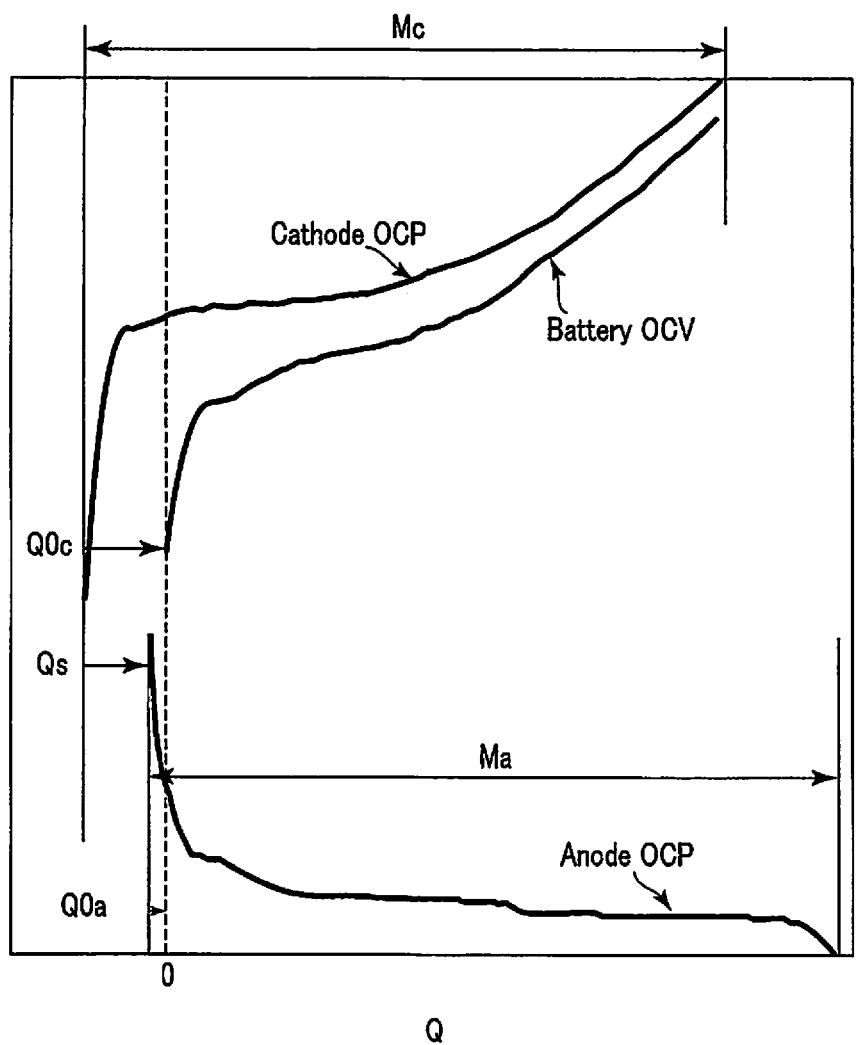
FIG. 7 is a graph exemplifying the relationship between the initial charge amount of the cathode, the initial charge amount of the anode, and the combination position of the cathode and anode.

The combination position estimator 209 calculates an estimate combination position of the cathode and anode of the target secondary battery every unit time. The combination position represents the positional relationship between the charge amount of the cathode with the SOC being 0 [%], or in other words the initial charge amount of the cathode, and the charge amount of the anode with the SOC being 0[%], or in other words the initial charge amount of the anode. For the combination position, the individual initial charge amounts for a cathode and for an anode do not need to be represented. The combination position will suffice if it represents how much one is shifted with respect to the other. In the following explanation, the combination position is defined as a shift of the initial charge amount of the cathode with reference to the initial charge amount of the anode. An exemplary relationship of the initial charge amount of the cathode Qc, the initial charge amount of the anode Qa, and the cathode/anode combination position Qs is illustrated in FIG. 7.

The combination position estimator 209 reads, from the parameter storage 102, the estimate initial charge amount of the cathode Q0c(t) and the estimate initial charge amount of the anode Q0a(t). Then, the combination position estimator 209 calculates the estimate cathode/anode combination position (Qs(t)) of the secondary battery at time t in accordance with formula (13).

$$Qs(t) = Q0c(t) - Q0a(t) \quad (13)$$

The charge amount limit calculator 210 calculates the upper charge amount limit and the lower charge amount limit of the target secondary battery every unit time. The upper charge amount limit represents the charge amount of the secondary battery when the estimate OCV of the secondary battery corresponds to the upper limit voltage. The lower charge amount limit represents the charge amount of the secondary battery when the estimate OCV of the secondary battery corresponds to the lower limit voltage.

The charge amount limit calculator 210 reads from the parameter storage 102 the estimate capacity of the cathode Mc(t), the estimate capacity of the anode Ma(t), the estimate initial charge amount of the cathode Q0c(t), the estimate initial charge amount of the anode Q0a(t), the functions fc(SOCc) and fa(SOCa), the upper limit voltage, and the lower limit voltage. Then, the charge amount limit calculator 210 finds the upper charge amount limit Qu(t) that satisfies the formula (14) and the lower charge amount limit Ql(t) that satisfies the formula (15).

$$Vu = fc\left(\frac{Qu(t) + Q0c(t)}{Mc(t)}\right) - fa\left(\frac{Qu(t) + Q0a(t)}{Ma(t)}\right) \quad (14)$$

$$Vl = fc\left(\frac{Ql(t) + Q0c(t)}{Mc(t)}\right) - fa\left(\frac{Ql(t) + Q0a(t)}{Ma(t)}\right). \quad (15)$$

The battery capacity estimator 211 calculates the capacity of the target secondary battery (battery capacity) every unit time. Specifically, the battery capacity estimator 211 reads the upper charge amount limit Qu(t) and the lower charge amount limit Ql(t) from the parameter storage 102. The battery capacity estimator 211 calculates the estimate capacity FCC(t) of the secondary battery at time t in accordance with formula (16).

$$FCC(t) = Qu(t) - Ql(t) \quad (16)$$

As discussed earlier, the reduction of the battery capacity is a phenomenon that occurs as the secondary battery becomes deteriorated. This may be influenced by various factors of the internal state of the secondary battery that are deteriorated. For example, as is clear from formula (16), the battery capacity of the secondary battery can be reduced by the upper charge amount limit being lowered and/or the lower charge amount limit being increased.

To describe this visually, the OCV of a non-deteriorated secondary battery and the OCPs of the cathode and anode are indicated in FIG. 3 as an example. In FIG. 3 and other drawings, the OCV is shown in a range between the lower limit voltage and the upper limit voltage (i.e., in the range of the SOC of the secondary battery between 0% and 100%). In actuality, however, the OCPs of the cathode and anode may be able to charge and discharge even when the OCV exceeds the upper/lower limit voltages of the secondary battery. In other words, the battery SOC being 0[%] or 100[%] does not always mean the SOC of the cathode and/or anode also being 0[%] or 100[%]. Thus, the OCPs may be illustrated as also being in the range of the charge amount of the secondary battery exceeding the upper/lower-limit voltages.

Figure 4:
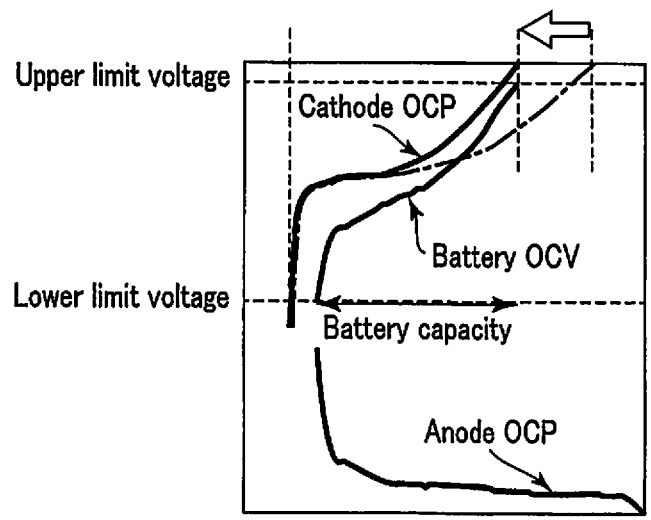
FIG. 4 is a graph showing examples of OCV of the secondary battery and OCPs of the cathode and anode after the cathode capacity has decreased.
Figure 5:
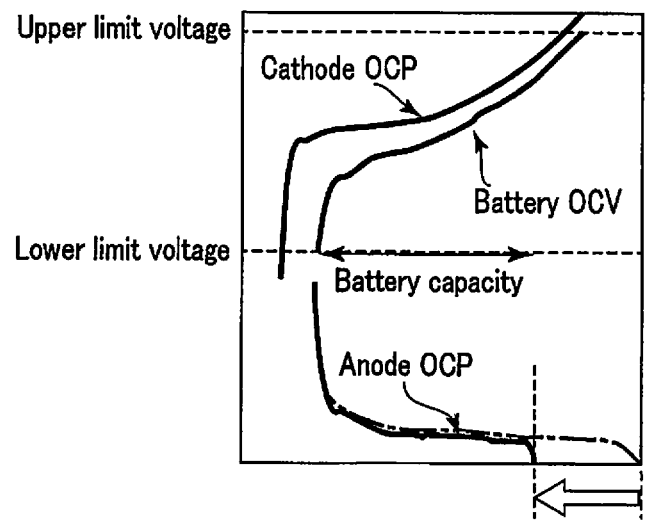
FIG. 5 is a graph showing examples of OCV of the secondary battery and OCPs of the cathode and anode after the anode capacity has decreased.
Figure 6:
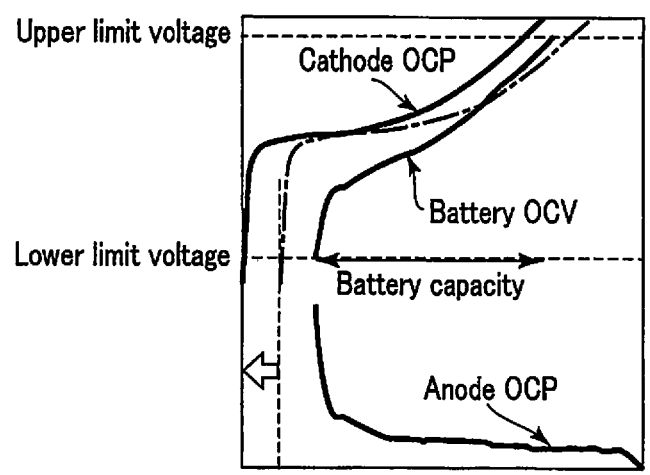
FIG. 6 is a graph showing examples of the OCV of the secondary battery and OCPs of the cathode and anode, in which the combination position where the curves for the cathode and anode correspond to each other has changed.

The secondary battery may become deteriorated and thereby reduce its cathode capacity. If this is the case, in accordance with a decrease in the upper charge amount limit of the secondary battery, the capacity of the secondary battery decreases, as illustrated in FIG. 4. Furthermore, this secondary battery may become deteriorated and thereby reduce its anode capacity. If this is the case, in accordance with a decrease in the upper charge amount limit of the secondary battery, the capacity of the secondary battery decreases, as illustrated in FIG. 5. Moreover, this secondary battery may become deteriorated and thereby largely shift the combination position of the cathode and anode, or in other words increase a shift of the initial charge amount of the cathode with reference to the initial charge amount of the anode (increasing the absolute value of the shift). If this is the case, as illustrated in FIG. 6, the upper charge amount limit of the secondary battery decreases while the lower charge amount limit increases. This results in a decrease in the capacity of the secondary battery. In the example of FIG. 6, the initial charge amount of the cathode is lowered. As mentioned earlier, however, in consideration of the combination position of the cathode and anode representing the positions of the initial charge amounts of the cathode and the anode relative to each other, the shift may also be increased when the initial charge amount of the anode is increased.

In view of the above, the capacity of the secondary battery may be reduced by factors such as a decreased cathode capacity, a decreased anode capacity, and a change in the combination position of the cathode and anode. In other words, even if two secondary batteries have the same capacity, the internal state of the secondary batteries may not be the same. The capacity of the cathode or anode may have been reduced, the position where the cathode and anode correspond to each other may have been changed, or these factors may have appeared in combination.

With the parameter estimator 103, the decrease in the capacity of the secondary battery can be analyzed with regard to a factor or combination of factors that cause the decrease. Specifically, the decrease in the cathode capacity can be monitored, based on the estimate capacity of the cathode calculated by the cathode capacity estimator 201 every unit time. The decrease in the anode capacity can be monitored based on the estimate capacity of the anode calculated by the anode capacity estimator 202 every unit time. The change in the combination position of the cathode and anode can be monitored based on the estimate combination position calculated by the combination position estimator 209 every unit time.

In addition, the parameter estimator 103 is capable of estimating the internal resistance of the secondary battery, as discussed below.

The cathode coefficient calculator 212 calculates every unit time the first increase coefficient, which is a deterioration rate relating to the first resistance term of the internal resistance of the target secondary battery that is dependent on the SOC of the cathode. Specifically, the cathode coefficient calculator 212 reads from the parameter storage 102 the first increase coefficient Uc(t−1) at time t−1 and the first internal resistance deterioration coefficient δUc(t−1) that depends at least on the SOC of the cathode at time t−1, and the time difference Δt. The parameter storage 102 stores therein Uc(0) as one of the initial values. The cathode coefficient calculator 212 calculates the first increase coefficient Uc(t) at time t in accordance with formula (17).

$$Uc(t) = Uc(t-1) + \delta Uc(t-1)\Delta t \quad (17)$$

The anode coefficient calculator 213 calculates every unit time the second increase coefficient, which is a deterioration rate relating to the second resistance term of the internal resistance of the target secondary battery that is dependent on the SOC of the anode. Specifically, the anode coefficient calculator 213 reads from the parameter storage 102 the second increase coefficient Ua(t−1) at time t−1, the second internal resistance deterioration coefficient δUa(t−1) that depends at least on the SOC of the anode at time t−1, and the time difference Δt. The parameter storage 102 stores therein Ua(0) as one of the initial values. The anode coefficient calculator 213 calculates the second increase coefficient Ua(t) at time t in accordance with the formula (18).

$$Ua(t)=Ua(t-1)+\delta Ua(t-1)\Delta t \tag{18}$$

The internal resistance estimator 214 calculates the estimate internal resistance of the target secondary battery every unit time. Specifically, the internal resistance estimator 214 reads from the parameter storage 102 the estimate cathode SOC (SOCc(t)), the estimate anode SOC (SOCa(t)), the first increase coefficient Uc(t), the second increase coefficient Ua(t), the function Rc(SOCc) that returns the value of the first resistance term corresponding to the SOC of the cathode, and the function Ra(SOCa) that returns the value of the second resistance term corresponding to the SOC of the anode. The functions Rc(SOCc) and Ra(SOCa) may be derived from experiments or simulations. Then, the internal resistance estimator 214 calculates the estimate internal resistance R(t) of the secondary battery at time t in accordance with formula (19).

$$R(t)=Uc(t)Rc(SOCc(t))+Ua(t)Ra(SOCa(t)) \tag{19}$$

Figure 8:
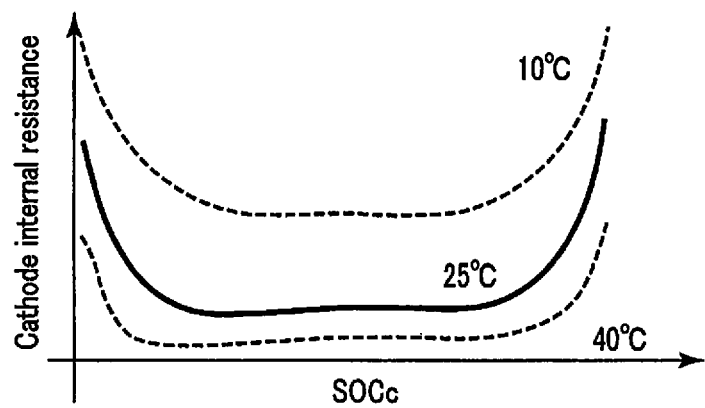
FIG. 8 is a graph exemplifying the relationship between the SOC of the cathode and the first resistance term (cathodic internal resistance) of the internal resistance that is dependent on the SOC of the cathode, in accordance with temperature.
Figure 9:
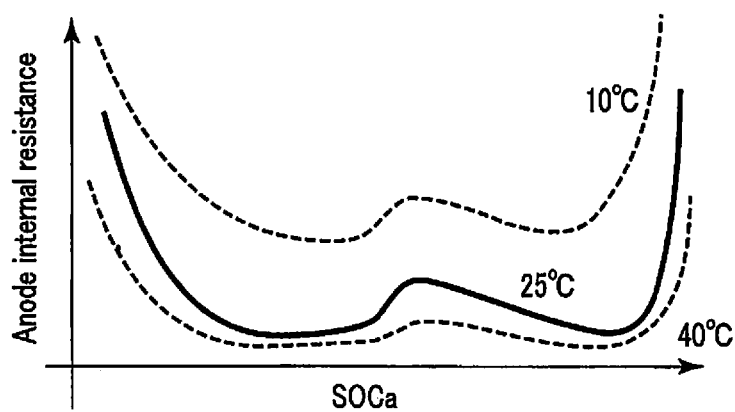
FIG. 9 is a graph exemplifying the relationship between the SOC of the anode and the second resistance term (anodic internal resistance) of the internal resistance that is dependent on the SOC of the anode, in accordance with temperature.

In formula (19), Rc(SOCc(t)) represents the estimate value of the first resistance term at time t, and Ra(SOCa(t)) represents the estimate value of the second resistance term at time t. As illustrated in FIGS. 8 and 9, the values of the first resistance term for the SOC of the cathode and the second resistance term for the SOC of the anode may vary depending on the temperature of the battery. For this reason, respective functions $Rc_T$(SOCc) and functions $Ra_T$(SOCa) may be adopted for different temperatures T, or the function Rc(SOCc, T) and function Ra(SOCa, T) that include the temperature T as an additional argument may be adopted. Alternatively, the influence of the temperature T on the first resistance term and the second resistance term may be expressed as a multiplication of a coefficient Kr(T). This coefficient Kr(T) may be defined separately as a coefficient Krc(T) for the cathode and a coefficient Kra(T) for the anode. Any of these coefficients may be derived from experiments or simulations. As the temperature T, the temperature measurement value indicated by the temperature data in the input data may be used, or an estimate battery temperature calculated by the battery temperature estimator 218, which will be described later, may be used.

As described above, the parameter estimator 103 can monitor an increase in the internal resistance of the secondary battery, based on the internal resistance calculated every unit time by the internal resistance estimator 214.

The battery voltage estimator 215 calculates an estimate battery voltage of the target secondary battery every unit time. Specifically, the battery voltage estimator 215 reads the estimate OCV (OCV(t)), the estimate internal resistance R(t) and the current measurement value I(t) from the parameter storage 102. Then, the battery voltage estimator 215 calculates the estimate battery voltage V(t) at time t in accordance with formula (20).

$$V(t)=OCV(t)+R(t)I(t) \tag{20}$$

Of the internal resistance, the first resistance term and the second resistance term depend on the battery temperature, as discussed above. Furthermore, the accuracy of the determination of the aforementioned various deterioration coefficients including the cathode capacity deterioration coefficient, the anode capacity deterioration coefficient, the anode charge amount deterioration coefficient, the first internal resistance deterioration coefficient and the second internal resistance deterioration coefficient can be improved by taking into consideration the battery temperature, in addition to the SOC of the cathode and the SOC of the anode. For the battery temperature, the temperature measurement value indicated by the temperature data in the input data may be adopted. Alternatively, the battery temperature may be thermologically estimated by the parameter estimator 103, as explained below.

The temperature change ΔT of the secondary battery per unit time Δt may be expressed by formula (21).

$$\Delta T = \frac{W}{Cb}\Delta t \tag{21}$$

In formula (21), W denotes the amount of heat generation, which can be estimated by the heat amount estimator 217 described later. Cb denotes the thermal capacity of the secondary battery, which can be derived from experiments or simulations. The amount of heat generation W may be expressed by formula (22).

$$W = (V - OCV)I + \frac{I}{F}T\Delta Sb(Q) - H(T - Te) \tag{22}$$

In formula (22), V denotes the battery voltage, OCV denotes the open circuit voltage, and F denotes the Faraday constant. T denotes the battery temperature, and ΔSb(Q) denotes the entropy change amount corresponding to the battery charge amount Q. The entropy change amount can be estimated by the entropy estimator 216, which will be described later. Moreover, H denotes the heat transfer ratio between the battery and ambient air, which may be derived from experiments or simulations. Te denotes the ambient temperature, for which the (ambient) temperature measurement value indicated by the temperature data included in the input data, for example, may be adopted.

Figure 10:
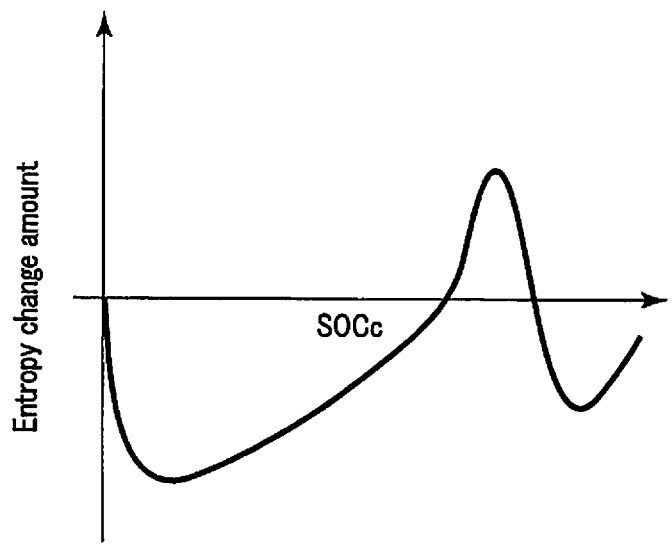
FIG. 10 is a graph exemplifying the relationship between the SOC of the cathode and the first entropy change term of the entropy change amount that is dependent on the SOC of the cathode.
Figure 11:
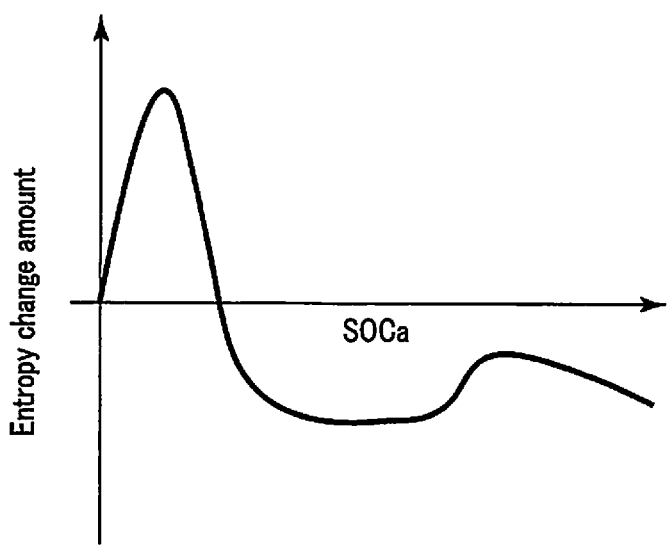
FIG. 11 is a graph exemplifying the relationship between the SOC of the anode and the first entropy change term of the entropy change amount that is dependent on the SOC of the anode.

The entropy estimator 216 calculates the entropy change amount of the target secondary battery every unit time. Specifically, the entropy estimator 216 reads from the parameter storage 102 the SOC of the cathode (SOCc(t)) and the SOC of the anode (SOCa(t)), the function ΔSc(SOCc) that returns the value of the first entropy change term corresponding to the SOC of the cathode (illustrated in FIG. 10), and the function ΔSa(SOCa) that returns the value of the second entropy change term corresponding to the SOC of the anode (illustrated in FIG. 11). The function ΔSc(SOCc) and the function ΔSa(SOCa) may be derived from experiments or simulations. The entropy estimator 216 calculates the estimate entropy change amount ΔSb(Q(t)) of the secondary battery at time t in accordance with formula (23).

$$\Delta Sb(Q(t))=\Delta Sc(SOCc(t))-\Delta Sa(SOCa(t)) \tag{23}$$

The heat amount estimator 217 calculates the estimate heat generation amount of the target secondary battery every unit time. Specifically, the heat amount estimator 217 reads the estimate battery voltage V(t), the estimate OCV (OCV(t)), the current measurement value I(t), the Faraday constant F, the estimate entropy change amount ΔSb(Q(t)), the heat transfer ratio H, the ambient temperature Te, and the estimate battery temperature T(t−1) at time t−1. The parameter storage 102 stores therein T(0) as one of the initial values. Then, the heat amount estimator 217 calculates the estimate heat generation amount W(t) of the secondary battery at time t in accordance with formula (24).

$$W(t) = (V(t) - OCV(t))I(t) - \frac{1}{F}T(t-1)\Delta Sb(Q(t))H(T(t-1)-Te) \quad (24)$$

The battery temperature estimator 218 calculates the estimate battery temperature of the target secondary battery every unit time. Specifically, the battery temperature estimator 218 reads from the parameter storage 102 the estimate battery temperature T(t−1), the estimate heat generation amount W(t), the thermal capacity Cb, and the time difference Δt. Then, the battery temperature estimator 218 calculates the estimate battery temperature T(t) at time t in accordance with formula (25).

$$T(t) = T(t-1) + \frac{W(t)}{Cb}\Delta t \quad (25)$$

The aforementioned deterioration coefficients, including the cathode capacity deterioration coefficient, the anode capacity deterioration coefficient, the anode charge amount deterioration coefficient, the first internal resistance deterioration coefficient and the second internal resistance deterioration coefficient, are described in detail below.

Figure 13:
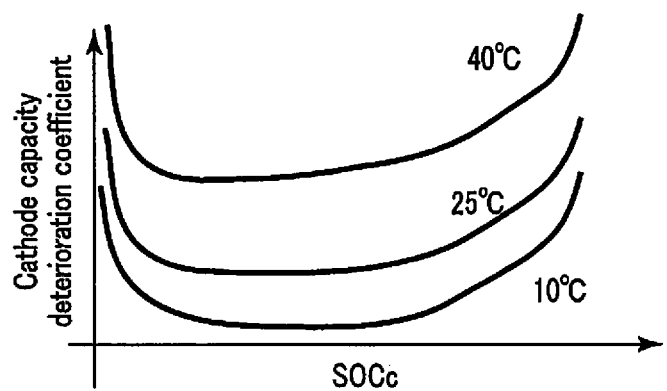
FIG. 13 is a graph exemplifying the relationship between the SOC of the cathode and the cathode capacity deterioration coefficient in accordance with the temperature.

The cathode capacity deterioration coefficient δMc(t) may be derived by applying the estimate cathode SOC (SOCc(t)) to the function δMc(SOCc) that returns the cathode capacity deterioration coefficient corresponding to the SOC of the cathode. The cathode capacity deterioration coefficient corresponding to the SOC of the cathode may vary depending on the battery temperature, as illustrated in FIG. 13. For this reason, individual functions $\delta Mc_T(SOCc)$ may be adopted for different temperatures T, or the function δMc(SOCc, T) that includes the temperature T as an additional argument may be adopted. The cathode capacity deterioration coefficient corresponding to the SOC of the cathode may also vary depending on the current. For this reason, individual functions $\delta Mc_I(SOCc)$ (or function $\delta MC_{I,T}(SOCc)$) may be adopted for different currents I (and different temperatures T), or a function δMc(SOCc, I) (or function δMc (SOCc, I, T)) that includes the current I (and temperature T) as an additional argument may be adopted. Any of these functions may be derived from experiments or simulations.

The function $\delta Mc_T(SOCc)$ of FIG. 13 is presented merely as an example. The function $\delta Mc_T(SOCc)$ may be defined so as to return a negative value that monotonically decreases with respect to SOCc.

Alternatively, it is assumed that the cathode capacity deteriorates (decreases) in proportion to time to the power of 0.5, and that the change of the deterioration rate due to the battery temperature conforms to the Arrhenius equation and depends on the size of the current and the SOC of the cathode. Then, the cathode capacity deterioration coefficient δMc(t) may also be expressed by formula (26).

$$\delta Mc(t) = -\frac{klc(S0Cc(t))}{Mc(0) - Mc(t)} \times Am \times \exp\left(\frac{-Bm}{T(t)+273}\right) \times hc(I(t)) \quad (26)$$

According to formula (26), the cathode capacity deterioration coefficient is a function of the cathode capacity, the battery temperature, the SOC of the cathode and the battery current. In formula (26), klc(SOCc) denotes the function that expresses the deterioration of the capacity in proportional to time to the power of 0.5 and depends on the SOC of the cathode (SOCc). The function klc(SOCc) can be determined on measurement results obtained from calendar tests that are pre-conducted under various SOCs of the cathode. Am and Bm are coefficients that define the function for representing the change of the deterioration ratio that conforms to the Arrhenius equation, by the battery temperature. Am and Bm may be determined based on the measurement results obtained from the calendar tests that are pre-conducted under various battery temperatures. The function hc(I) determines the dependency of the deterioration rate by the battery current(I). The function hc(I) may be determined based on the measurement results of the cycle tests that are pre-conducted under various charging and discharging rates.

Other deterioration coefficients including the anode capacity deterioration coefficient, the anode charge amount deterioration coefficient, the first internal resistance deterioration coefficient and second internal resistance deterioration coefficient may also be derived by using the functions similar to the above.

In the above explanation, the deterioration coefficients are described as each being stored in the form of an LUT table in the parameter storage 102. However, the parameter estimator 103 may be configured to read the function such as the function Mc(SOCc) from the parameter storage 102 to calculate the deterioration coefficient.

Figure 12:
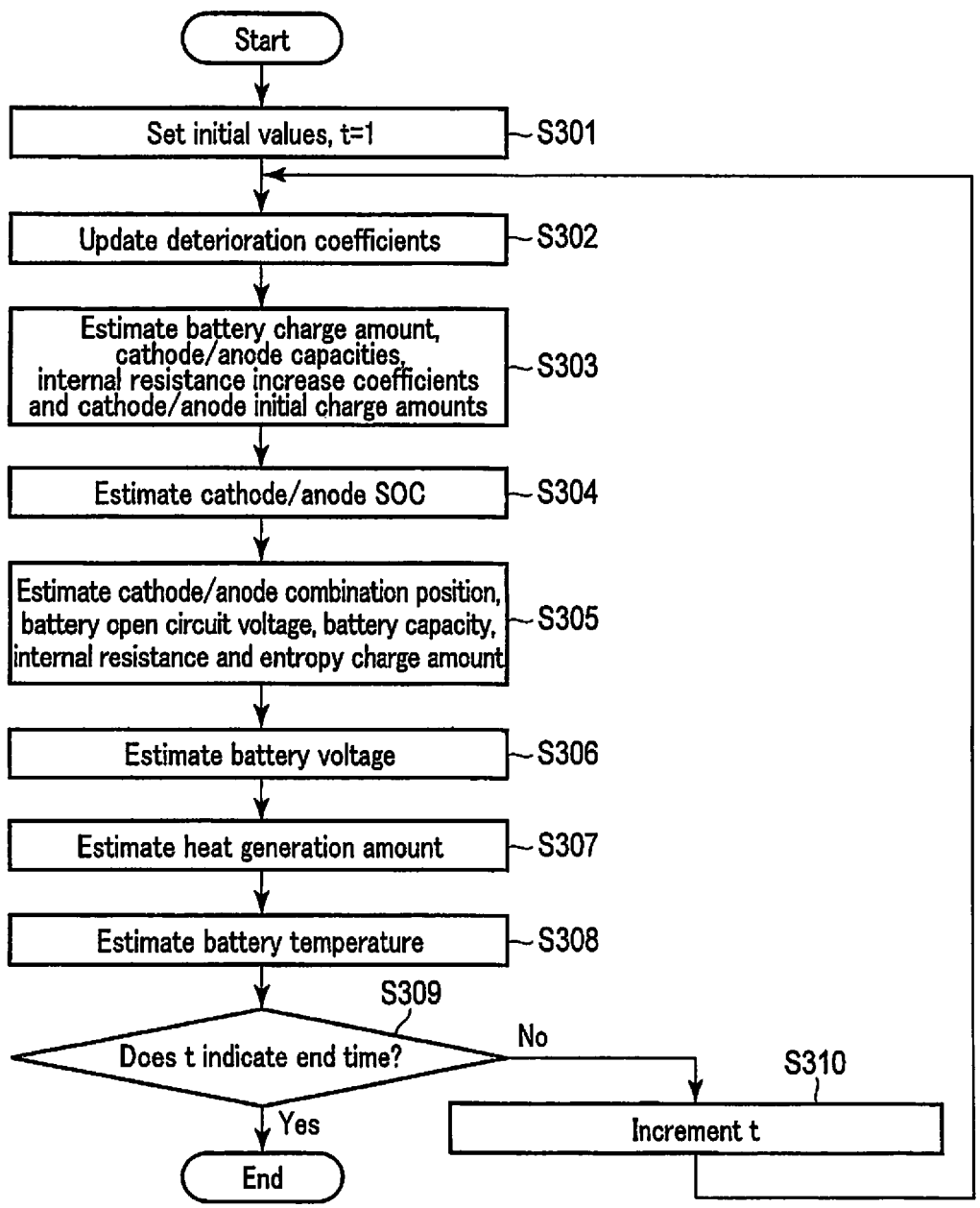
FIG. 12 is a flowchart illustrating an exemplary operation of the parameter estimator illustrated in FIG. 2.

The operation of the parameter estimator 103 in FIG. 2 may be explained by referring to FIG. 12.

First, the parameter estimator 103 reads from the parameter storage 102 various initial values including the initial values for the estimate capacities of the cathode and the anode, the estimate battery charge amount of the secondary battery, the estimate initial charge amounts of the cathode and the anode, the first increase coefficient, the second increase coefficient, and the battery temperature, and initializes the variable t for the counter to 1 (step S301). After step S301, the process proceeds to step S302.

At step S302, the parameter estimator 103 updates various deterioration coefficients, based on the input data stored in the parameter storage 102, and the initial values set at step S301 or parameters estimated at steps S303 to S307 in the previous iteration. Specifically, the parameter estimator 103 updates the cathode capacity deterioration coefficient, the anode capacity deterioration coefficient, the anode charge amount deterioration coefficient, the first internal resistance deterioration coefficient, and/or the second internal resistance deterioration coefficient at time t−1, based on the estimate cathode and/or anode SOC at time t−1, the current measurement value, and/or the estimate battery temperature or temperature measurement value at time t−1.

Next, the parameter estimator 103 calculates the estimate battery charge amount Q(t), the estimate capacity of the cathode Mc(t), the estimate capacity of the anode Ma(t), the estimate initial charge amount of the cathode Q0c(t), the estimate initial charge amount of the anode Q0a(t), the first increase coefficient Uc(t), and the second increase coefficient Ua(t), based on the input data stored in the parameter storage 102, the initial values set at step S301 or various parameters estimated at steps S303 to S307 in the previous iteration, and the deterioration coefficients updated at step S302 (step S303).

The parameter estimator 103 further calculates, based on the various parameters estimated at step S303, the estimate cathode SOC (SOCc(t)) and the estimate anode SOC (SOCa(t)) (step S304).

The parameter estimator 103 calculates the estimate combination position of the cathode and anode (Qs(t)), the estimate OCV (OCV(t)) of the secondary battery, the estimate capacity FCC (t) of the secondary battery, the estimate internal resistance R(t) of the secondary battery, and the estimate entropy change amount ΔSb(Q(t)) of the secondary battery, based on the various parameters estimated at steps S303 and S309 (step S305).

The parameter estimator 103 calculates the estimate battery voltage V(t), based on the input data stored in the parameter storage 102 and the various parameters estimated at step S305 (step S306).

The parameter estimator 103 calculates the estimate heat generation amount W(t) of the secondary battery, based on the input data stored in the parameter storage 102, the various parameters estimated at steps S303, S305 and S306, and the initial value T(0) of the battery temperature set at step S301 or the estimate battery temperature T(t−1) calculated at step S308 in the previous iteration (step S307).

The parameter estimator 103 calculates the estimate battery temperature T(t), based on the estimate heat generation amount W(t) of the secondary battery calculated at step S306, and the initial value T(0) of the battery temperature set at step S301 or the estimate battery temperature T (t−1) calculated at step S308 in the previous iteration (step S308).

After step S308, the parameter estimator 103 determines whether or not the variable t reaches the value indicating the end time (step S309). If the variable t reaches the value indicating the end time, the process is terminated. If not, the process proceeds to step S310. At step S310, the parameter estimator 103 increments the variable t, and the process returns to step S302.

As explained above, the internal state estimation apparatus according to the first embodiment estimates the cathode and anode capacities, using various deterioration coefficients that depend at least on the SOC of the cathode or anode. As a result, with this internal state estimation apparatus, the decrease in cathode or anode capacity, which is effective in the analysis of the deterioration factors of a battery capacity, can be ascertained.

This internal state estimation apparatus may be configured to estimate the initial charge amounts of the cathode and anode based on the estimate battery charge amount, the estimate capacities of the cathode and anode, and the aforementioned deterioration coefficients, and further estimate the combination position of the cathode and anode based on the estimated initial charge amounts. As a result, with this internal state estimation apparatus, the change of the combination position of the cathode and anode, which is effective in the analysis of the deterioration factors of the battery capacity, can be ascertained.

Furthermore, the internal state estimation apparatus may estimate the internal resistance of the secondary battery, using various deterioration coefficients depending at least on the SOC of the cathode or anode. As a result, with this internal state estimation apparatus, an increase in the internal resistance, which is one of the phenomena that can be observed when the battery becomes deteriorated, can be ascertained.

Second Embodiment

As described above, the internal state estimation apparatus according to the first embodiment may be configured to estimate the internal resistance of the target secondary battery. An internal state estimation apparatus according to the second embodiment is configured to estimate the internal resistance of the target secondary battery, separately as an ohmic resistance, reaction resistance, and diffusion resistance.

Figure 14:
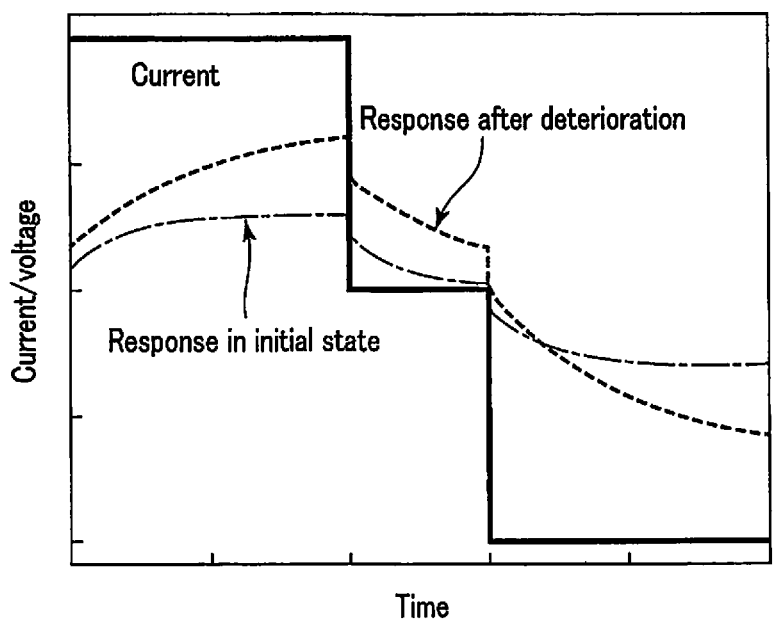
FIG. 14 is a graph illustrating exemplary transient responses of the battery voltage before and after the deterioration of the secondary battery.

The ohmic resistance denotes a direct-current resistance (component) that does not have a time constant. On the other hand, the reaction resistance and diffusion resistance are both expressed by an RC circuit model with a time constant, which includes a resistance value and a time constant-related capacity. Specifically, the time constant of the reaction resistance is approximately one second. The time constant of the diffusion resistance is greater than the time constant of the reaction resistance by several tens of seconds or more. Since the internal resistance of the secondary battery contains resistance components having time constants, the time constant may change before and after the deterioration of the secondary battery, as can be seen from the transient responses of the battery voltage illustrated in FIG. 14.

When the secondary battery becomes deteriorated, these resistance and capacity components do not increase altogether, but increase at different rates. For this reason, the estimation of each of these resistance and capacitance components serves effectively in ascertaining the details of the increase in the internal resistance.

The cathode coefficient calculator 212 calculates the aforementioned first increase coefficient every unit time, separately as respective coefficients corresponding to an ohmic resistance component, a resistance component and capacity component of a reaction resistance, and a resistance component and capacity component of a diffusion resistance. Specifically, the cathode coefficient calculator reads from the parameter storage 102, five coefficients in relation to the first increase coefficient at time t−1, namely Uc1(t−1), Uc2(t−1), . . . , and Uc5(t−1), five internal resistance deterioration coefficients that depend at least on the SOC of the cathode at time t−1, namely δUc1(t−1), δUc2 (t−1), . . . , and δUc5 (t−1), and time difference Δt. The parameter storage 102 stores therein Uc1(0), Uc2(0), . . . , and Uc5(0) as initial values. Then, the cathode coefficient calculator 212 calculates five constants Uc1(t), Uc2(t), and Uc5(t) in relation to the first increase coefficient at time t, in accordance with formulae (27).

$$Uc1(t)=Uc1(t-1)+\delta Uc1(t-1)\Delta t,$$

$$Uc2(t)=Uc2(t-1)+\delta Uc2(t-1)\Delta t,$$

$$Uc3(t)=Uc3(t-1)+\delta Uc3(t-1)\Delta t,$$

$$Uc4(t)=Uc4(t-1)+\delta Uc4(t-1)\Delta t,$$

$$Uc5(t)=Uc5(t-1)+\delta Uc5(t-1)\Delta t \quad (27)$$

In formulae (27), Uc1(t), Uc2(t), Uc3(t), Uc4(t) and Uc5(t) denote coefficients corresponding to the ohmic resistance component, the resistance component of the reaction resistance, the capacity component of the reaction resistance, the resistance component of the diffusion resistance, and the capacity component of the diffusion resistance, respectively.

The anode coefficient calculator 213 calculates the aforementioned second increase coefficient every unit time, separately as coefficients corresponding to an ohmic resistance component, a resistance component and a capacity component of the reaction resistance, and a resistance component and a capacity component of the diffusion resistance. Specifically, the anode coefficient calculator reads from the parameter storage 102, five coefficients in relation to the second increase coefficient at time t−1, namely Ua1(t−1), Ua2(t−1), . . . , Ua5(t−1), five internal resistance deterioration coefficients that depend at least on the SOC of the anode at time t−1, namely δUa1(t−1), δUa2(t−1), ..., δUa5(t−1), and the time difference Δt. The parameter storage 102 stores therein Ua1(0), Ua2(0), ..., Ua5(0) as initial values. Then, the anode coefficient calculator 213 calculates five coefficients Ua1(t), Ua2(t), ..., Ua5 (t) in relation to the second increase coefficient at time t in accordance with formulae (28).

$$Ua1(t)=Ua1(t-1)+\delta Ua1(t-1)\Delta t,$$

$$Ua2(t)=Ua2(t-1)+\delta Ua2(t-1)\Delta t,$$

$$Ua3(t)=Ua3(t-1)+\delta Ua3(t-1)\Delta t,$$

$$Ua4(t)=Ua4(t-1)+\delta Ua4(t-1)\Delta t,$$

$$Ua5(t)=Ua5(t-1)+\delta Ua5(t-1)\Delta t \quad (28)$$

In formulae (28), Ua1(t), Ua2(t), Ua3(t), Ua4(t) and Ua5(t) respectively denote the ohmic resistance component, the resistance component of the reaction resistance, the capacity component of the reaction resistance, the resistance component of the diffusion resistance, and the capacity component of the diffusion resistance.

The internal resistance estimator 214 calculates the estimate internal resistance of the target secondary battery every unit time, separately as an ohmic resistance component, a resistance component and capacity component of the reaction resistance, and a resistance component and capacity component of the diffusion resistance. Specifically, the internal resistance estimator 214 reads from the parameter storage 102: the estimate cathode SOC (SOCc(t)); the estimate anode SOC (SOCa(t)); the five components of the first increase coefficient, Uc1(t), Uc2(t), ..., Uc5(t); the five components of the second increase coefficient, Ua1(t), Ua2 (t), ..., Ua5(t); the function Roc(SOCc) that returns the value of the ohmic resistance component corresponding to the SOC of the cathode; the function Roa(SOCa) that returns the value of the ohmic resistance component corresponding to the SOC of the anode; the function Rrc(SOCc) that returns the value of the resistance component of the reaction resistance corresponding to the SOC of the cathode; the function Rra(SOCa) that returns the value of the resistance component of the reaction resistance corresponding to the SOC of the anode; the function Crc(SOCc) that returns the value of the capacity component of the reaction resistance corresponding to the SOC of the cathode; the function Cra(SOCa) that returns the value of the capacity component of the reaction resistance corresponding to the SOC of the anode; the function Rdc(SOCc) that returns the value of the resistance component of the diffusion resistance corresponding to the SOC of the cathode; the function Rda(SOCa) that returns the value of the resistance component of the diffusion resistance corresponding to the SOC of the anode; the function Cdc(SOCc) that returns the value of the capacity component of the diffusion resistance corresponding to the SOC of the cathode; and the function Cda(SOCa) that returns the value of the capacity component of the diffusion resistance corresponding to the SOC of the anode. The functions exemplified here may be derived from experiments or simulations. These functions may be defined for different battery temperatures, as described above, may be defined to include the battery temperature as an additional argument, or may be defined as being multiplied by a coefficient depending on the battery temperature. The internal resistance estimator 214 calculates the estimate internal resistance of the secondary battery at time t, respectively for different components in accordance with formulae (29).

$$Ro(t)=Uc1(t)Roc(SOCc(t))+Ua1(t)Roa(SOCa(t)),$$

$$Rr(t)=Uc2(t)Rrc(SOCc(t))+Ua2(t)Rra(SOCa(t)),$$

$$Cr(t)=Uc3(t)Crc(SOCc(t))+Ua3(t)Cra(SOCa(t)),$$

$$Rd(t)=Uc4(t)Rdc(SOCc(t))+Ua4(t)Rda(SOCa(t)),$$

$$Cd(t)=Uc5(t)Cdc(SOCc(t))+Ua5(t)Cda(SOCa(t)) \quad (29)$$

In formulae (29), Ro(t), Rr(t), Cr(t), Rd(t) and Cd(t) denote the ohmic resistance component, the resistance component of the reaction resistance, the capacity component of the reaction resistance, the resistance component of the diffusion resistance, and the capacity component of the diffusion resistance, respectively, of the estimate internal resistance at time t.

With the internal state estimation apparatus according to the present embodiment, an increase in the internal resistance of the secondary battery can be monitored at a component level based on the internal resistance calculated every unit time by the internal resistance estimator 214.

As explained above, the internal state estimation apparatus according to the second embodiment estimates the internal resistance of the secondary battery, separately as an ohmic resistance, a resistance component and capacity component of the reaction resistance, and a resistance component and capacity component of the diffusion resistance, using the deterioration coefficients that depend at least on the SOC of the cathode or anode. As a result, with this internal state estimation apparatus, a change of the time constant can be ascertained, in addition to an increase in the internal resistance itself.

Third Embodiment

The internal state estimation apparatus according to the first embodiment (or second embodiment) can assist the control of a secondary battery. A battery control system according to the third embodiment is configured to control the current of a secondary battery at the time of charging and discharging, based on the parameters estimated by the internal state estimation apparatus of the first embodiment.

The battery control system according to the third embodiment includes a battery control apparatus 400, a secondary battery 420, a load/power source 430, a current measurer 440, and a voltage measurer 450, as illustrated in FIG. 15.

A typical secondary battery 420 is a lithium-ion secondary battery. The charging and discharging of the secondary battery 420 may be controlled by the battery control apparatus 400. The secondary battery 420 is coupled to the load/power source 430 at the time of discharging or charging.

The current measurer 440 may be an ammeter. The current measurer 440 measures the current (battery current) flowing through the circuit including the secondary battery 920 and the load/power source 430, and outputs a signal indicating the current measurement value to the battery control apparatus 400.

A typical voltage measurer 450 may be a voltmeter. The voltage measurer 450 measures a voltage (battery voltage) applied between the two ends of the secondary battery 420, and outputs a signal indicating the voltage measurement value to the battery control apparatus 400.

The structure may be further provided with a temperature measurer, although it is not shown, which measures the temperature or ambient temperature of the secondary battery 420.

The battery control apparatus 400 includes the aforementioned internal state estimation apparatus 100 and a charge/discharge controller 410. The charge/discharge controller 410 may correspond to a processor.

The charge/discharge controller 410 may control the current flowing through the secondary battery 420, based on the deterioration level of the secondary battery 420 estimated by the internal state estimation apparatus 100. Specifically, the charge/discharge controller 410 may be configured to set the maximum usable current of the secondary battery 420 at the time of charging and discharging, and to suppress the current through the secondary battery 420 if the current measurer 440 detects the current measurement value exceeding this maximum current. The charge/discharge controller 410 may lower the maximum current as the ratio of the estimate capacity of the cathode or anode to the initial capacity of the cathode or anode (i.e., Mc(0) or Ma(0)). As a result, the maximum current that has been determined on the premise of an initial-state secondary battery 420 would not be maintained after the secondary battery is deteriorated.

The charge/discharge controller 410 may shut down the current through the secondary battery 420, based on the deterioration level of the secondary battery 420 estimated by the internal state estimation apparatus 100. Specifically, the charge/discharge controller 410 may be configured to set the upper/lower limit SOC for the cathode or anode of the secondary battery 420 and to shut down the current through the secondary battery 420 when the SOC of the cathode or anode estimated by the internal state estimation apparatus 100 exceeds the upper/lower limit SOC. The charge/discharge controller 410 may lower the upper limit SOC of the cathode or anode in accordance with a decrease in the capacity of the cathode or anode, or may raise the lower limit SOC of the cathode or anode in accordance with a decrease in the capacity of the cathode or anode. As a result, the upper/lower limit SOC that has been determined on the premise of an initial-state secondary battery 420 would not be maintained after the secondary battery is deteriorated.

An exemplary operation of the battery control system of FIG. 15 is explained by referring to FIG. 16. When the operation of FIG. 16 is initiated, the process proceeds to step S501.

At step S501, the current measurer 440 measures the current flowing through the secondary battery 420, and the voltage measurer 450 measures the voltage applied between the two ends of the secondary battery 420. Optionally, a temperature measurer (not shown) may measure the temperature and/or ambient temperature of the secondary battery 420.

The data measured at step S501 is obtained by the measurement data acquirer 101 of the internal state estimation apparatus 100, and is stored in the parameter storage 102 of the internal state estimation apparatus 100 (step S502).

The parameter estimator 103 of the internal state estimation apparatus 100 estimates various internal state parameters of the secondary battery 420, based on the measurement data stored in the parameter storage 102 at step S502 and the parameters estimated at step S503 of the previous iteration and stored in the parameter storage 102 (step S503).

The charge/discharge controller 410 determines whether or not the current control conditions are satisfied based on the internal state parameters estimated at step S503. The charge/discharge controller 410 may update the maximum usable current for the secondary battery 420 at the time of charging and discharging, based on the estimate capacity of the cathode or anode and the like, and determine whether the current measurement values stored in the parameter storage 102 at step S502 exceed this maximum current. Alternatively, the charge/discharge controller 410 may update the upper/lower limit SOC of the cathode or anode of the secondary battery 420, based on the estimate capacity of the cathode or anode, and determine whether the estimate SOC of the cathode or anode exceeds this upper/lower limit SOC. The process proceeds to step S505 if the current control conditions are satisfied. If not, the process proceeds to step S506.

At step S505, the charge/discharge controller 410 execute's the current control on the secondary battery 420, such as current suppression and shutdown. After step S505, the process proceeds to step S506.

At step S506, it is determined as to whether the use of the battery ends. If the use of the battery ends, the process of FIG. 16 is terminated. If not, the process returns to step S501.

As described above, the battery control system according to the third embodiment executes the current control of the secondary battery at the time of charging and discharging, based on the estimate capacity of the cathode or anode calculated according to the first embodiment. With this battery control system, the conditions for executing the current suppression and shutdown are eased in accordance with the deterioration state of the secondary battery, thereby preventing an overcurrent from flowing through the deteriorated secondary battery.

Fourth Embodiment

The internal state estimation apparatus according to the fourth embodiment can reduce estimate errors by combining the aforementioned estimation technique for internal state parameters of the first and second embodiments with regression calculation.

Specifically, in addition to part or all of the components of the aforementioned internal state estimation apparatus 100, the internal state estimation apparatus according to the fourth embodiment is provided with a parameter update unit. This parameter update unit performs a regression calculation, based on part or all of the input data stored in the parameter storage 102, or in other words a measured current value and/or measured power value, and also on a measured (battery) voltage value, and the like. Based on the result of this regression calculation, the parameter update unit updates at least part of the internal state parameters stored in the parameter storage 102.

The parameter update unit may update the estimate capacities of the cathode and anode, the estimate initial charge amounts of the cathode and anode, and/or estimate internal resistance of the secondary battery, based on the current/voltage values measured at multiple time points during the constant current charging by using, for example, the technique disclosed in JP-A 2015-111086 (KOKAI) or any similar technique.

An exemplary operation of the internal state estimation apparatus according to the fourth embodiment is explained by referring to FIG. 17. With the operation of FIG. 17 started, the process proceeds to step S601.

At step S601, the current flowing through the target secondary battery, the voltage applied between the two ends of the secondary battery, and the temperature and/or ambient temperature of the secondary battery. The measurements may be conducted by the aforementioned current measurer 440 and voltage measurer 450.

The data measured at step S601 is obtained by the measurement data acquirer 101 of the internal state estimation apparatus, and stored in the parameter storage 102 of the internal state estimation apparatus (step S602).

After step S602, the parameter update unit determines as to whether the amount of measurement data required for the regression calculation is stored in the parameter storage 102 (step S603). If an amount of measurement data required for the regression calculation is stored in the parameter storage 102, the process proceeds to step S606. If not, the process proceeds to step S604.

At step S604, the parameter estimator 103 of the internal state estimation apparatus estimates the internal state parameters, and stores them in the parameter storage 102. In the case of the operation proceeding from step S607 to step S604, the parameter estimator 103 uses the parameters updated by the parameter update unit to estimate the internal state parameters.

At step S606, the parameter update unit performs the regression calculation based on the measurement data stored in the parameter storage 102 (step S606), and updates, based on the result of this regression calculation, the parameters such as the estimate capacities of the cathode and anode, the estimate initial charge amounts of the cathode and anode, and/or the estimate internal resistance of the secondary battery (step S607). After step S607, the operation proceeds to step S604.

After step S604, it is determined whether to terminate the process (step S605). If the process of FIG. 17 is not completed, the operation returns to step S601.

As explained above, according to the fourth embodiment, the technique of estimating the internal state parameters according to the first and second embodiments is combined with regression calculation so that the internal state estimation apparatus can update the parameters based on the result of the regression calculation. As a result, this internal state estimation apparatus is configured to correct numerical errors in various deterioration coefficients stored every unit time and/or measurement errors in the battery current or the like, and differences between the design time and operational time of the deterioration coefficients or the like.

Modification Examples

In the aforementioned embodiments, the technique of estimating the present or past internal state of a secondary battery, based on the current and/or power values actually measured at multiple time points during the charging and/or discharging of the secondary battery, has been described. Such measurement values may be replaced, for example, with estimate values of the current and/or power at multiple time points during the charging and/or discharging of the secondary battery. With such a replacement, the future internal state of the secondary battery can be estimated. The estimate values of the current and/or power may be derived from a known simulation method, statistically derived from charging/discharging behaviors of secondary batteries of the same type or similar type, or empirically determined.

According to the above embodiments, several functional units have been described, but these are merely examples of the functional units. The functional units described as being mounted on a single apparatus may be mounted separately on different apparatuses. The functional units described as being mounted separately on different apparatuses may be mounted on a single apparatus.

The functional units explained in the above embodiments may be realized by circuits. The circuits may be specifically designed to realize specific functions, or may be a general-purpose circuit such as a processor.

At least part of the process of the embodiments may be realized by using a processor mounted in a general-purpose computer as basic hardware. The program that realizes the above process may be stored and provided in a computer-readable storage medium. The program may be stored in the storage medium as a file of an installable format or a file of an executable format. Examples of the storage medium include a magnetic disk, optical disk (CD-ROM, CD-R, DVD, etc.), magneto-optical disk (MO, etc.), and a semiconductor memory. Any storage medium that can store programs and can be read by a computer may be adopted. The program that realizes the process may be stored on a computer (server) connected to a network such as the Internet, and downloaded onto a computer (client) via the network.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An internal state estimation apparatus for a secondary battery, the apparatus comprising:

an acquirer configured to acquire input data including at least one of (a) current measurement values and/or power measurement values measured at a plurality of time points during charging and/or discharging of the secondary battery, and (b) estimate current values and/or estimate power values at a plurality of time points during charging and/or discharging of the secondary battery;

a battery capacity estimator configured to, based on the input data, an estimate battery charge amount of the secondary battery at a first time point, and a time difference between the first time point and a second time point that is later than the first time point, calculate an estimate battery charge amount of the secondary battery at the second time point;

a cathode capacity estimator configured to, based on an estimate capacity of a cathode of the secondary battery at the first time point, a cathode capacity deterioration coefficient that is dependent at least on a state of charge (SOC) of the cathode at the first time point, and the time difference, calculate an estimate capacity of the cathode at the second time point;

an anode capacity estimator configured to, based on an estimate capacity of an anode of the secondary battery at the first time point, an anode capacity deterioration coefficient that is dependent at least on a SOC of the anode at the first time point, and the time difference, calculate an estimate capacity of the anode at the second time point;

a cathode charge amount estimator configured to, based on an estimate initial charge amount of the cathode at the first time point, the estimate battery charge amount at the first time point, the cathode capacity deterioration coefficient, the estimate capacity of the cathode at the first time point, and the time difference, calculate an estimate initial charge amount of the cathode at the second time point;

an anode charge amount estimator configured to, based on an estimate initial charge amount of the anode at the first time point, the estimate battery charge amount at the first time point, the anode capacity deterioration coefficient, the time difference, the estimate capacity of the anode at the first time point, and an anode charge amount deterioration coefficient that is dependent at least on the SOC of the anode at the first time point, calculate an estimate initial charge amount of the anode at the second time point;

a cathode SOC estimator configured to, based on the estimate battery charge amount at the second time point, the estimate initial charge amount of the cathode at the second time point, and the estimate capacity of the cathode at the second time point, calculate a SOC estimate of the cathode at the second time point; and an anode SOC estimator configured to, based on the estimate battery charge amount at the second time point, the estimate initial charge amount of the anode at the second time point, and the estimate capacity of the anode at the second time point, calculate a SOC estimate of the anode at the second time point.

2. The apparatus according to claim 1, wherein at least one of the anode charge amount deterioration coefficient, the cathode capacity deterioration coefficient, and the anode capacity deterioration coefficient is further dependent on a temperature and/or current of the secondary battery.

3. The apparatus according to claim 1, further comprising a combination position estimator configured to calculate an estimate combination position of the cathode and anode of the secondary battery, based on the estimate initial charge amount of the cathode at the second time point and the estimate initial charge amount of the anode at the second time point.

4. The apparatus according to claim 1, further comprising an open circuit voltage estimator configured to calculate an estimate open circuit voltage of the secondary battery at the second time point, based on an estimate open circuit potential of the cathode at the second time point, which is dependent on the SOC of the cathode at the second time point, and an estimate open circuit potential of the anode at the second time point, which is dependent on the SOC of the anode at the second time point.

5. The apparatus according to claim 4, further comprising a battery voltage estimator configured to calculate an estimate battery voltage of the secondary battery at the second time point, based on the estimate open circuit voltage at the second time point, an internal resistance of the secondary battery at the second time point, and the input data.

6. The apparatus according to claim 1, further comprising:
a charge amount limit calculator configured to, based on the estimate initial charge amount of the cathode at the second time point, the estimate capacity of the cathode at the second time point, the estimate initial charge amount of the anode at the second time point, the estimate capacity of the anode at the second time point, an upper limit voltage of the secondary battery, and a lower limit voltage of the secondary battery, calculate an upper charge amount limit that is a battery charge amount when a voltage of the secondary battery matches the upper limit voltage, and a lower charge amount limit that is a battery charge amount when a voltage of the secondary battery matches the lower limit voltage; and a battery capacity estimator configured to subtract the lower charge amount limit from the upper charge amount limit to calculate an estimate capacity of the secondary battery at the second time point.

7. The apparatus according to claim 5, further comprising:
an entropy estimator configured to calculate an estimate entropy change amount of the secondary battery, based on the SOC estimate of the cathode and the SOC estimate of the anode;

a heat amount estimator configured to calculate an estimate heat generation amount of the secondary battery at the second time point based on the estimate battery voltage and the estimate open circuit voltage at the second time point, the input data, an estimate battery temperature of the secondary battery at the first time point, and the estimate entropy change amount at the second time point; and a battery temperature estimator configured to calculate an estimate battery temperature of the secondary battery at the second time point, based on the estimate battery temperature at the first time point, the estimate heat generation amount at the second time point, and the time difference.

8. The apparatus according to claim 1, further comprising:
a cathode coefficient calculator configured to, based on a first increase coefficient at the first time point for a first resistance term of an internal resistance of the secondary battery that is dependent on the SOC of the cathode, a first internal resistance deterioration coefficient that is dependent at least on the SOC of the cathode, and the time difference, calculate a first increase coefficient at the second time point;

an anode coefficient calculator configured to, based on a second increase coefficient at the first time point for a second resistance term of the internal resistance that is dependent on the SOC of the anode, a second internal resistance deterioration coefficient that is dependent at least on the SOC of the anode, and the time difference, calculate a second increase coefficient at the second time point; and an internal resistance estimator configured to, based on an estimate value of the first resistance term at the second time point, the first increase coefficient at the second time point, an estimate value of the second resistance term at the second time point, and the second increase coefficient at the second time point, calculate an estimate internal resistance of the secondary battery at the second time point.

9. The apparatus according to claim 8, wherein at least one of the first internal resistance deterioration coefficient and the second internal resistance deterioration coefficient is further dependent on a temperature and/or current of the secondary battery.

10. The apparatus according to claim 8, wherein
the cathode coefficient calculator calculates the first increase coefficient at the second time point, separately as respective coefficients corresponding to an ohmic resistance component, a resistance component and a capacity component of a reaction resistance, and a resistance component and a capacity component of a diffusion resistance, the anode coefficient calculator calculates the second increase coefficient at the second time point, separately as respective coefficients corresponding to an ohmic resistance component, a resistance component and a capacity component of a reaction resistance, and a resistance component and a capacity component of a diffusion resistance, and the internal resistance estimator calculates the estimate internal resistance at the second time point, separately as an ohmic resistance component, a resistance component and a capacity component of a reaction resistance, and a resistance component and capacity component of a diffusion resistance.

11. The apparatus according to claim 1, further comprising an update unit configured to perform a regression calculation based on the input data at a plurality of time points, to update at least one of the estimate capacity of the cathode, the estimate capacity of the anode, the estimate initial charge amount of the cathode, and the estimate initial charge amount of the anode, based on a result of the regression calculation.

12. A battery control apparatus, comprising:
the apparatus according to claim 1; and
a charge/discharge controller configured to determine whether a current control condition that is updated based on the estimate capacity of the cathode at the second time point and/or the estimate capacity of the anode at the second time point is satisfied, and to suppress or shut down a current flowing through the secondary battery if the current control condition is satisfied.

13. A method for estimating an internal state of a secondary battery, the method comprising:
acquiring input data including at least one of (a) current measurement values and/or power measurement values measured at a plurality of time points during charging and/or discharging of the secondary battery, and (b) estimate current values and/or estimate power values at a plurality of time points during charging and/or discharging of the secondary battery;
calculating an estimate battery charge amount of the secondary battery at a second time point, based on the input data, an estimate battery charge amount of the secondary battery at a first time point, and a time difference between the first time point and the second time point, wherein the second time point is later than the first time point;
calculating an estimate capacity of a cathode at the second time point, based on an estimate capacity of the cathode of the secondary battery at the first time point, a cathode capacity deterioration coefficient that is dependent at least on a state of charge (SOC) of the cathode at the first time point, and the time difference;
calculating an estimate capacity of an anode at the second time point, based on the estimate capacity of the anode of the secondary battery at the first time point, an anode capacity deterioration coefficient that is dependent at least on a SOC of the anode at the first time point, and the time difference;
calculating an estimate initial charge amount of the cathode at the second time point, based on an estimate initial charge amount of the cathode at the first time point, the estimate battery charge amount at the first time point, the cathode capacity deterioration coefficient, the estimate capacity of the cathode at the first time point, and the time difference;
calculating an estimate initial charge amount of the anode at the second time point, based on an estimate initial charge amount of the anode at the first time point, the estimate battery charge amount at the first time point, the anode capacity deterioration coefficient, the time difference, the estimate capacity of the anode at the first time point, and an anode charge amount deterioration coefficient that is dependent at least on the SOC of the anode at the first time point;
calculating a SOC estimate of the cathode at the second time point, based on the estimate battery charge amount at the second time point, the estimate initial charge amount of the cathode at the second time point, and the estimate capacity of the cathode at the second time point; and
calculating a SOC estimate of the anode at the second time point, based on the estimate battery charge amount at the second time point, the estimate initial charge amount of the anode at the second time point, and the estimate capacity of the anode at the second time point.

* * * * *